(12) United States Patent
Lin et al.

(10) Patent No.: US 11,069,578 B2
(45) Date of Patent: Jul. 20, 2021

(54) METHOD OF MANUFACTURING A SEMICONDUCTOR DEVICE

(71) Applicant: Taiwan Semiconductor Manufacturing Company, Ltd., Hsinchu (TW)

(72) Inventors: Tzu-Ching Lin, Hsinchu (TW); Tuoh Bin Ng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/427,981

(22) Filed: May 31, 2019

(65) Prior Publication Data

US 2020/0381309 A1 Dec. 3, 2020

(51) Int. Cl.
*H01L 21/00* (2006.01)
*H01L 27/092* (2006.01)
*H01L 29/78* (2006.01)
*H01L 21/8238* (2006.01)
*H01L 29/66* (2006.01)
*H01L 29/08* (2006.01)
(Continued)

(52) U.S. Cl.
CPC ............. *H01L 21/823821* (2013.01); *H01L 21/28518* (2013.01); *H01L 21/306* (2013.01); *H01L 21/823814* (2013.01); *H01L 21/823828* (2013.01); *H01L 21/823871* (2013.01); *H01L 27/0924* (2013.01); *H01L 29/0847* (2013.01); *H01L 29/66545* (2013.01); *H01L 29/66795* (2013.01); *H01L 29/785* (2013.01)

(58) Field of Classification Search
CPC ....... H01L 21/823821; H01L 21/28518; H01L 21/306; H01L 21/823814; H01L 21/823828; H01L 21/823871; H01L 27/0924; H01L 27/10823; H01L 27/10876; H01L 27/10826; H01L 27/10855; H01L 27/10879; H01L 29/0847; H01L 29/66545; H01L 29/66795; H01L 29/785
See application file for complete search history.

(56) References Cited

U.S. PATENT DOCUMENTS 8,497,528 B2 * 7/2013 Lee ................... H01L 21/31116
257/192
8,962,400 B2 2/2015 Tsai et al.
(Continued)

*Primary Examiner* — Nikolay K Yushin
(74) *Attorney, Agent, or Firm* — Slater Matsil, LLP

(57) ABSTRACT

A method for forming source/drain regions in a semiconductor device and a semiconductor device including source/drain regions formed by the method are disclosed. In an embodiment, a method includes etching a semiconductor fin to form a first recess, the semiconductor fin defining sidewalls and a bottom surface of the first recess, the semiconductor fin extending in a first direction; forming a source/drain region in the first recess, the source/drain region including a single continuous material extending from a bottom surface of the first recess to above a top surface of the semiconductor fin, a precursor gas for forming the source/drain region including phosphine ($PH_3$) and at least one of arsine ($AsH_3$) or monomethylsilane ($CH_6Si$); and forming a gate over the semiconductor fin adjacent the source/drain region, the gate extending in a second direction perpendicular the first direction.

20 Claims, 19 Drawing Sheets

(51) Int. Cl.
*H01L 21/285* (2006.01)
*H01L 21/306* (2006.01)

(56) References Cited

U.S. PATENT DOCUMENTS

| | | | |
|---|---|---|---|
| 8,987,791 B2 * | 3/2015 | Huang | H01L 29/66545 |
| | | | 257/288 |
| 9,029,226 B2 * | 5/2015 | Tsai | H01L 29/66492 |
| | | | 438/299 |
| 9,093,514 B2 | 7/2015 | Tsai et al. | |
| 9,142,643 B2 * | 9/2015 | Cheng | H01L 29/7834 |
| 9,236,267 B2 | 1/2016 | De et al. | |
| 9,245,805 B2 | 1/2016 | Yeh et al. | |
| 9,263,521 B2 * | 2/2016 | Jeong | H01L 29/66818 |
| 9,406,752 B2 * | 8/2016 | Feng | H01L 29/0847 |
| 9,418,897 B1 | 8/2016 | Ching et al. | |
| 9,520,482 B1 | 12/2016 | Chang et al. | |
| 9,570,586 B2 * | 2/2017 | Yu | H01L 21/845 |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 10,276,715 B2 * | 4/2019 | Tsai | H01L 29/7833 |
| 2011/0272739 A1 * | 11/2011 | Lee | H01L 21/02529 |
| | | | 257/192 |
| 2013/0011984 A1 * | 1/2013 | Wang | H01L 21/823412 |
| | | | 438/285 |
| 2014/0134818 A1 * | 5/2014 | Cheng | H01L 29/66636 |
| | | | 438/300 |
| 2014/0239354 A1 * | 8/2014 | Huang | H01L 29/66545 |
| | | | 257/288 |
| 2014/0264575 A1 * | 9/2014 | Tsai | H01L 29/785 |
| | | | 257/336 |
| 2016/0190251 A1 * | 6/2016 | Feng | H01L 29/0847 |
| | | | 257/288 |
| 2017/0250278 A1 * | 8/2017 | Tsai | H01L 29/7833 |
| 2019/0273133 A1 * | 9/2019 | Agrawal | H01L 29/1033 |

* cited by examiner

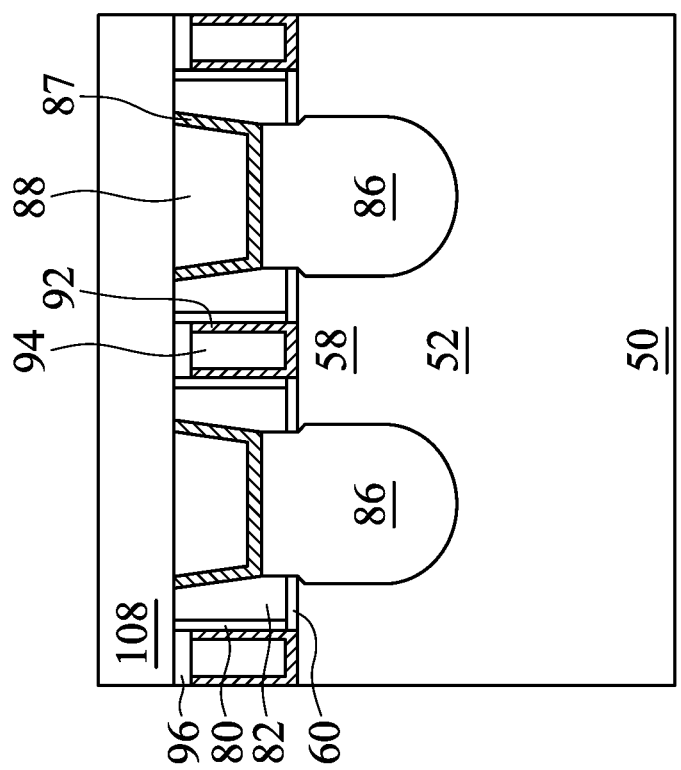
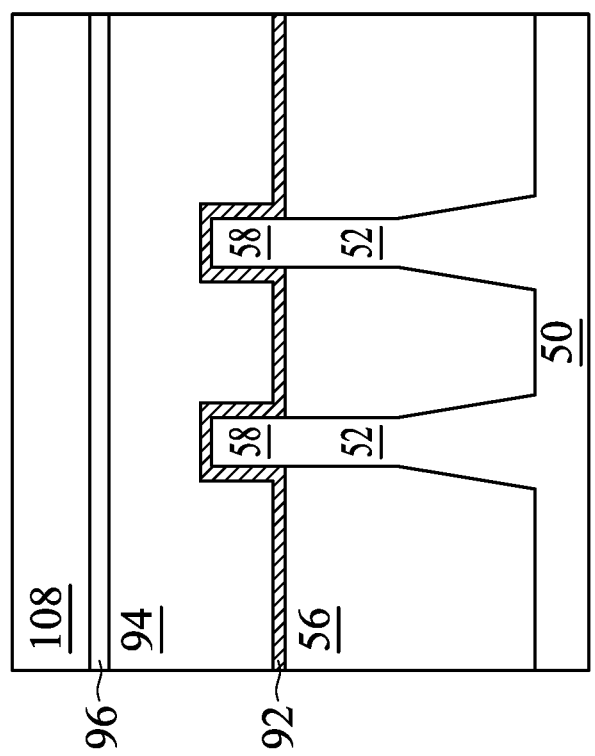
Figure 15B
Figure 15A

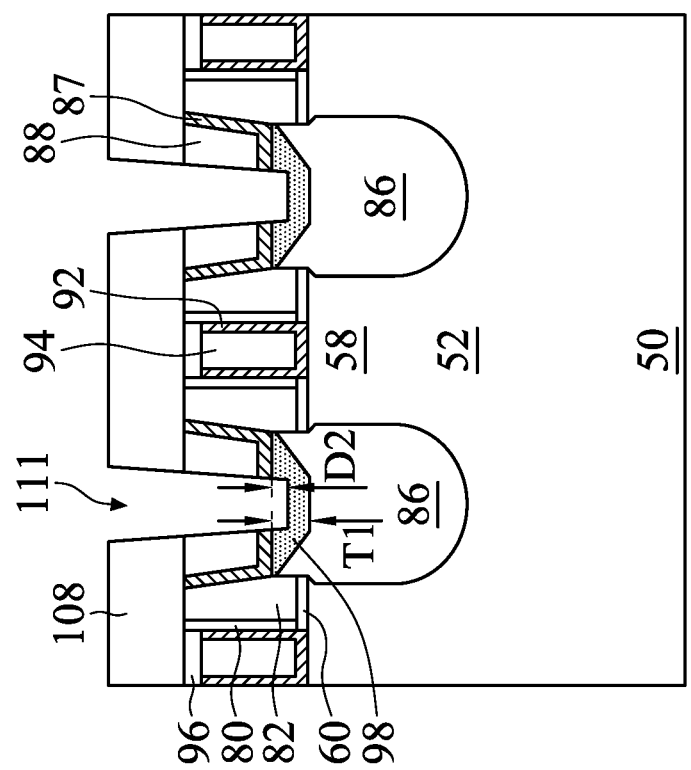
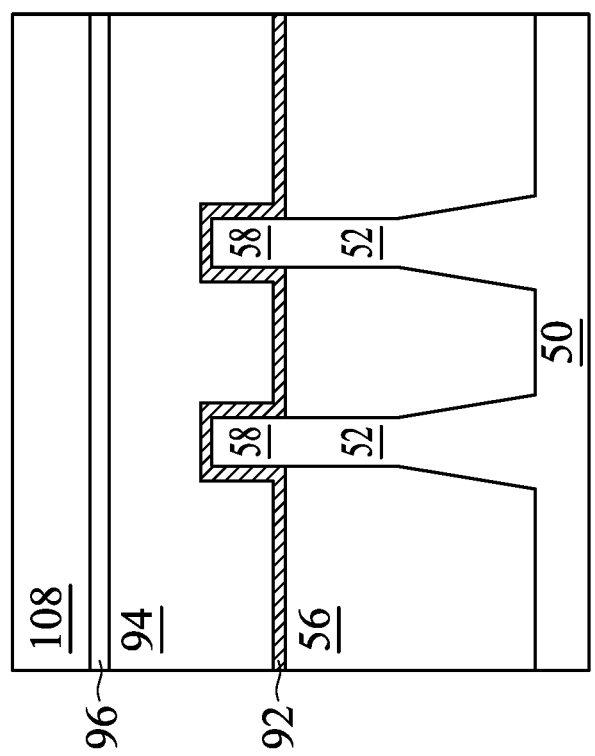
Figure 16B
Figure 16A

METHOD OF MANUFACTURING A SEMICONDUCTOR DEVICE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17A, and 17B are cross-sectional views of intermediate stages in the manufacturing of FinFETs, in accordance with some embodiments.

DETAILED DESCRIPTION

Figure 1:
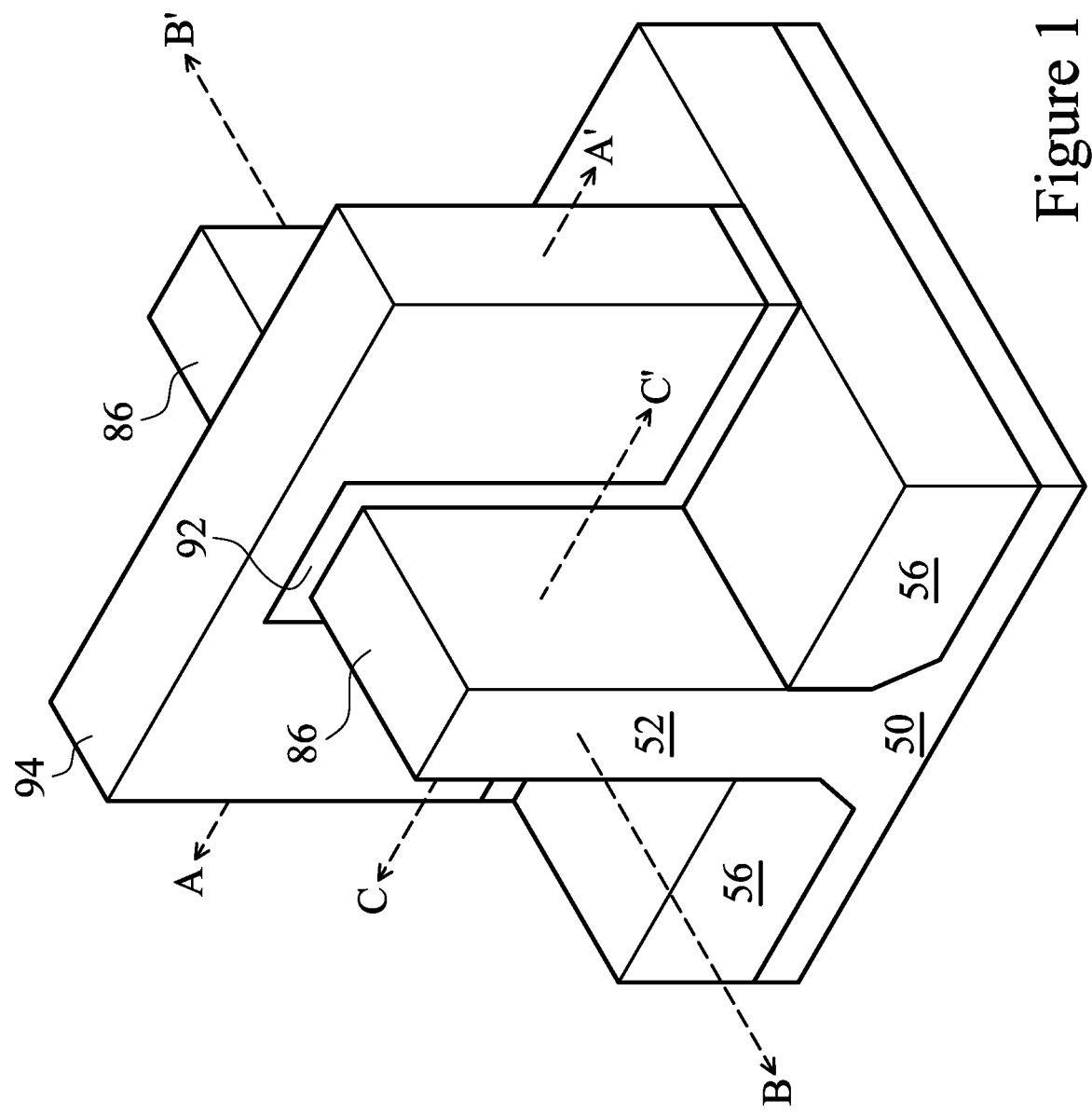
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A single material having a low dopant out-diffusion may be used for source/drain regions in a semiconductor device. The material may be doped with dopants having low diffusivity. In some embodiments, the source/drain regions may be N-type source/drain regions, which comprise phosphorus-doped silicon and the low-diffusivity dopants may comprise carbon and/or arsenic. The source/drain regions may have a phosphorus dopant concentration from about $1 \times 10^{21}$ to about $5 \times 10^{21}$ atoms/cm$^3$, an arsenic dopant concentration from about $1 \times 10^{20}$ to about $3 \times 10^{21}$ atoms/cm$^3$, and an atomic concentration of a carbon dopant from about 0.1% to about 2%. Forming the source/drain regions of the single material including the carbon and/or arsenic dopants reduces leakage from the source/drain regions and drain-induced barrier loading (DIBL) without requiring an additional source/drain layer formed of a second material, which allows the volume of the single material used to form the source/drain regions to be increased. This decreases the overall resistance of the source/drain regions, improves DC gain, and increases oscillator speed. Thus, device performance is improved.

FIG. 1 illustrates an example of a FinFET in a three-dimensional view, in accordance with some embodiments. The FinFET comprises a fin 52 on a substrate 50 (e.g., a semiconductor substrate). Shallow trench isolation (STI) regions 56 are disposed in the substrate 50, and the fin 52 protrudes above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring STI regions 56.

A gate dielectric layer 92 is along sidewalls and over a top surface of the fin 52, and a gate electrode 94 is over the gate dielectric layer 92. Source/drain regions 86 may be formed in portions of the fin 52 disposed on opposite sides of the gate dielectric layer 92 and the gate electrode 94, as will be discussed below in reference to FIGS. 10A-10D. FIG. 1 further illustrates reference cross-sections that are used in later figures. Cross-section A-A' is along a longitudinal axis of the gate electrode 94 and in a direction, for example, perpendicular to the direction of current flow between the source/drain regions 86 of the FinFET. Cross-section B-B' is perpendicular to cross-section A-A' and is along a longitudinal axis of the fin 52 and in a direction of, for example, a current flow between the source/drain regions 86 of the FinFET. Cross-section C-C' is parallel to cross-section A-A' and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 17B are cross-sectional views of intermediate stages in the manufacturing of FinFETs, in accordance with some embodiments. FIGS. 2 through 7 illustrate reference cross-section A-A' illustrated in FIG. 1, except for multiple fins/FinFETs. FIGS. 8A, 9A, 10A, 11A, 12A, 13A, 14A, 15A, 16A, and 17A are illustrated along reference cross-section A-A' illustrated in FIG. 1, and FIGS. 8B, 9B, 10B, 11B, 12B, 13B, 14B, 14C, 15B, 16B, and 17B are illustrated along a similar cross-section B-B' illustrated in FIG. 1, except for multiple fins/FinFETs. FIGS. 10C and 10D are illustrated along reference cross-section C-C' illustrated in FIG. 1, except for multiple fins/FinFETs.

Figure 2:
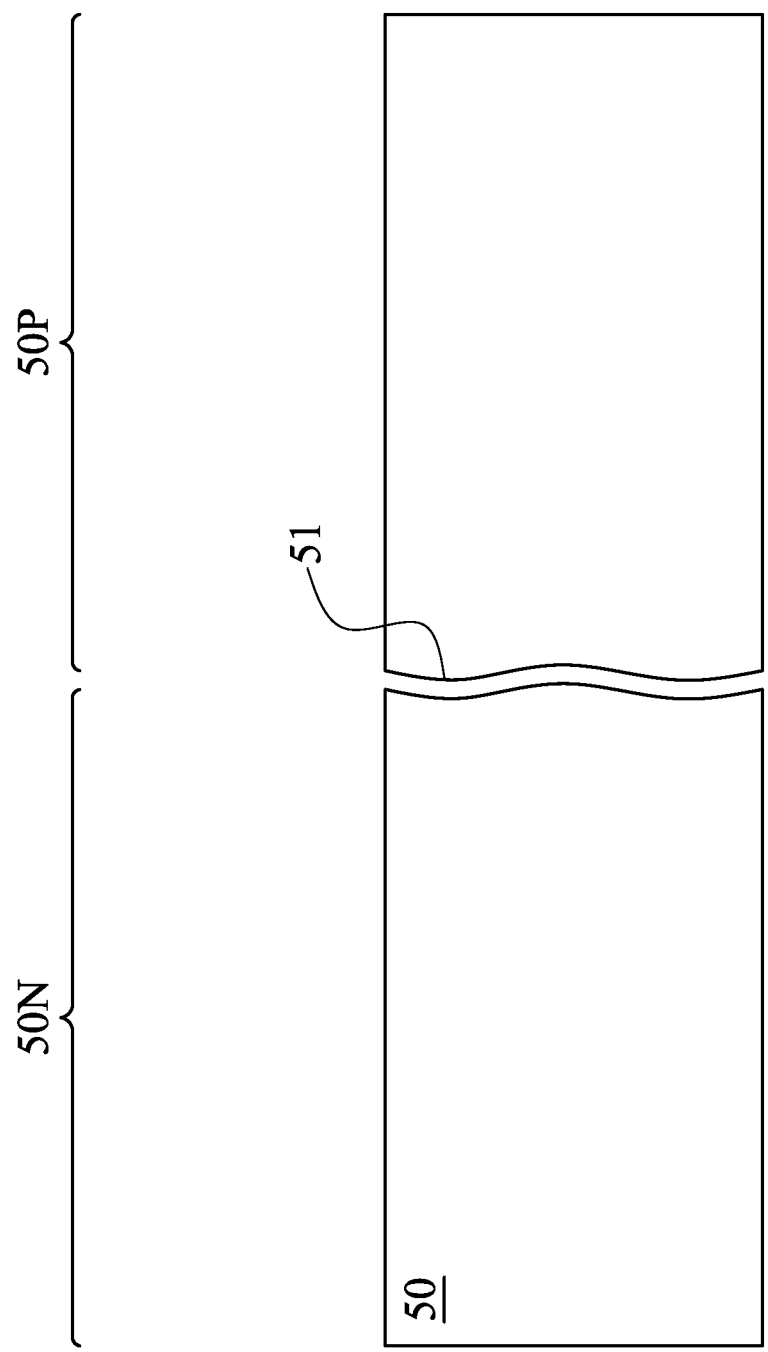

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
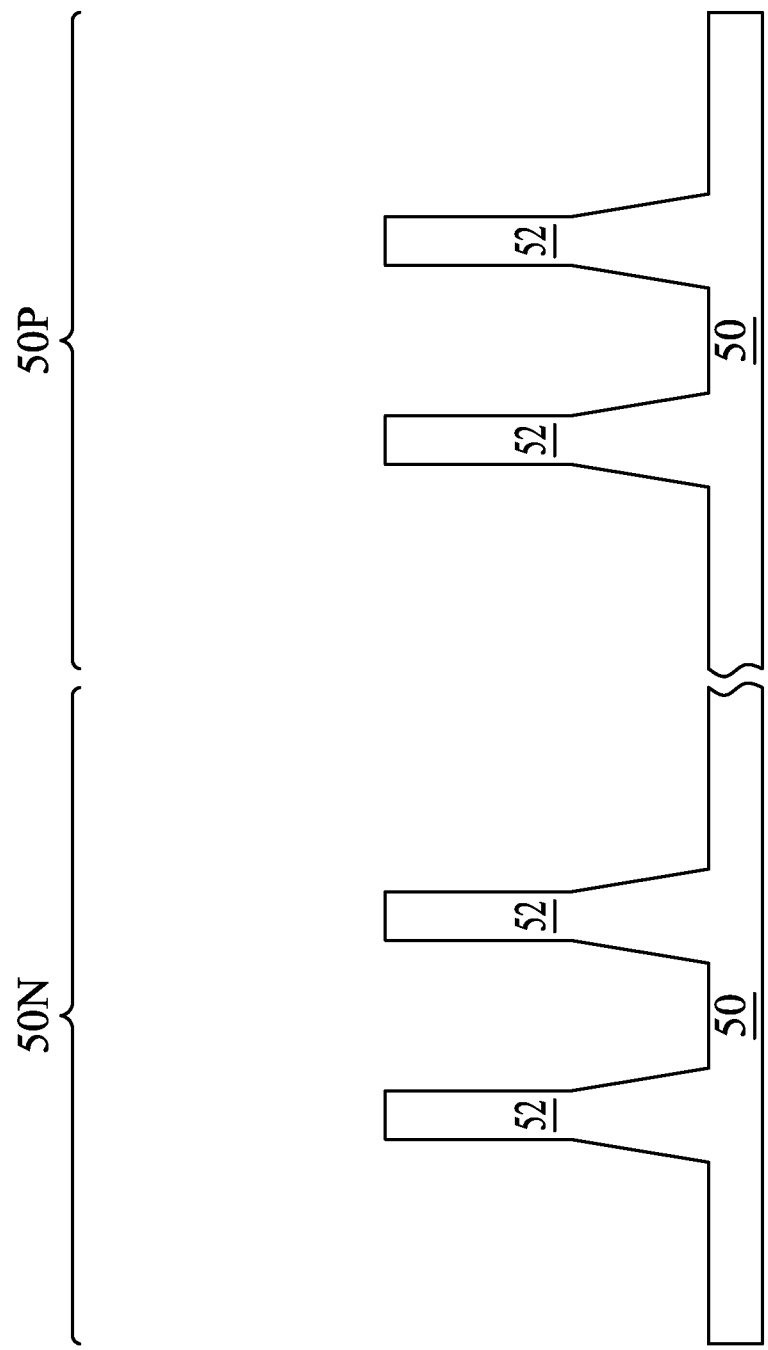

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etching may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not separately illustrated) is formed over the substrate 50 and patterned using a photolithography process. Spacers (not separately illustrated) are formed alongside the patterned sacrificial layer using a self-aligned process. The sacrificial layer is then removed, and the remaining spacers may then be used to pattern the fins 52.

Figure 4:
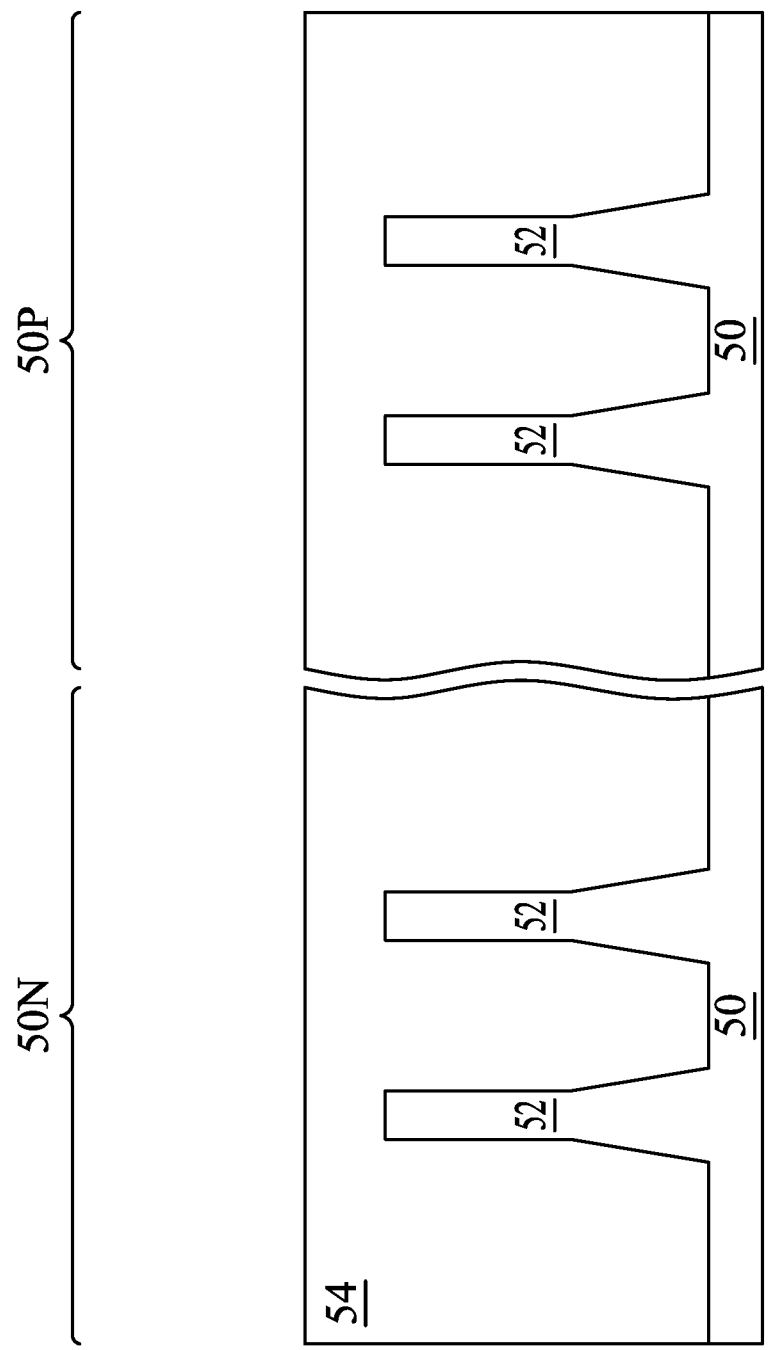

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
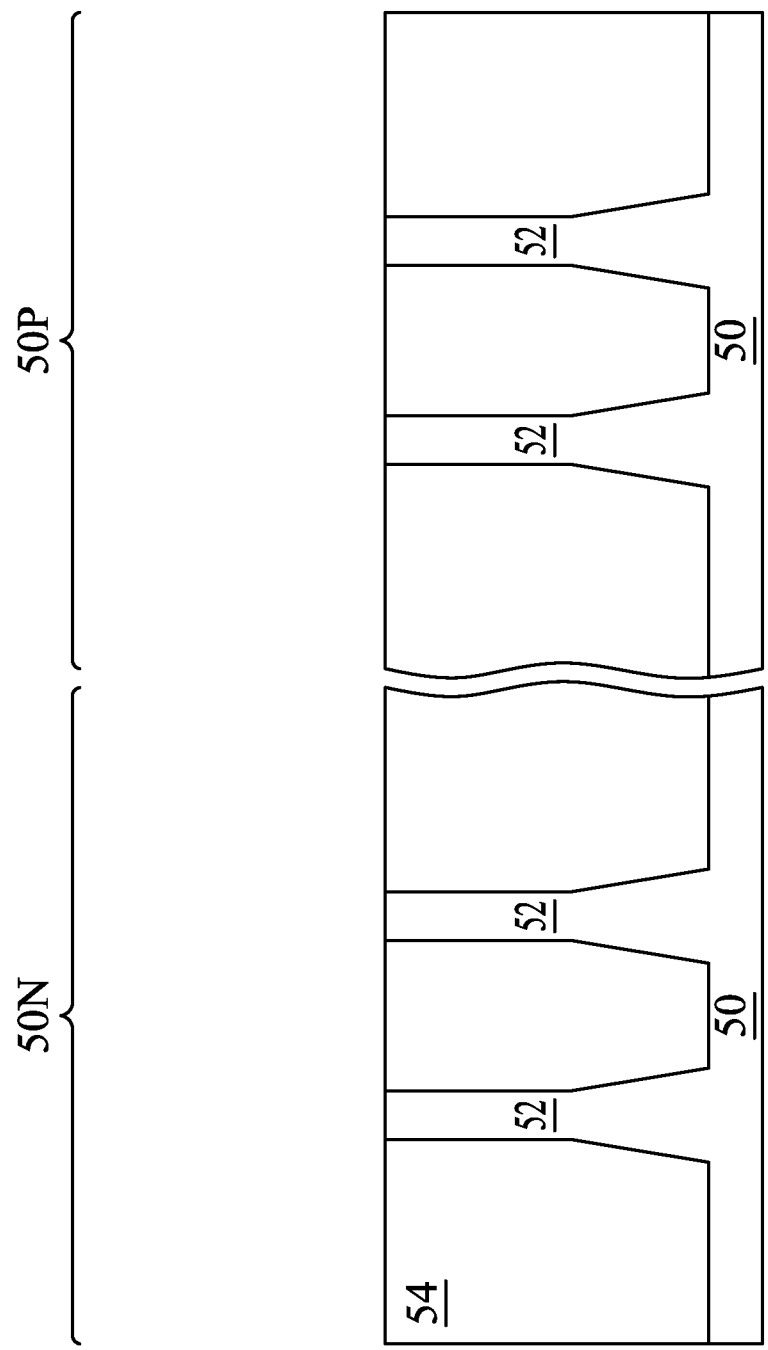

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
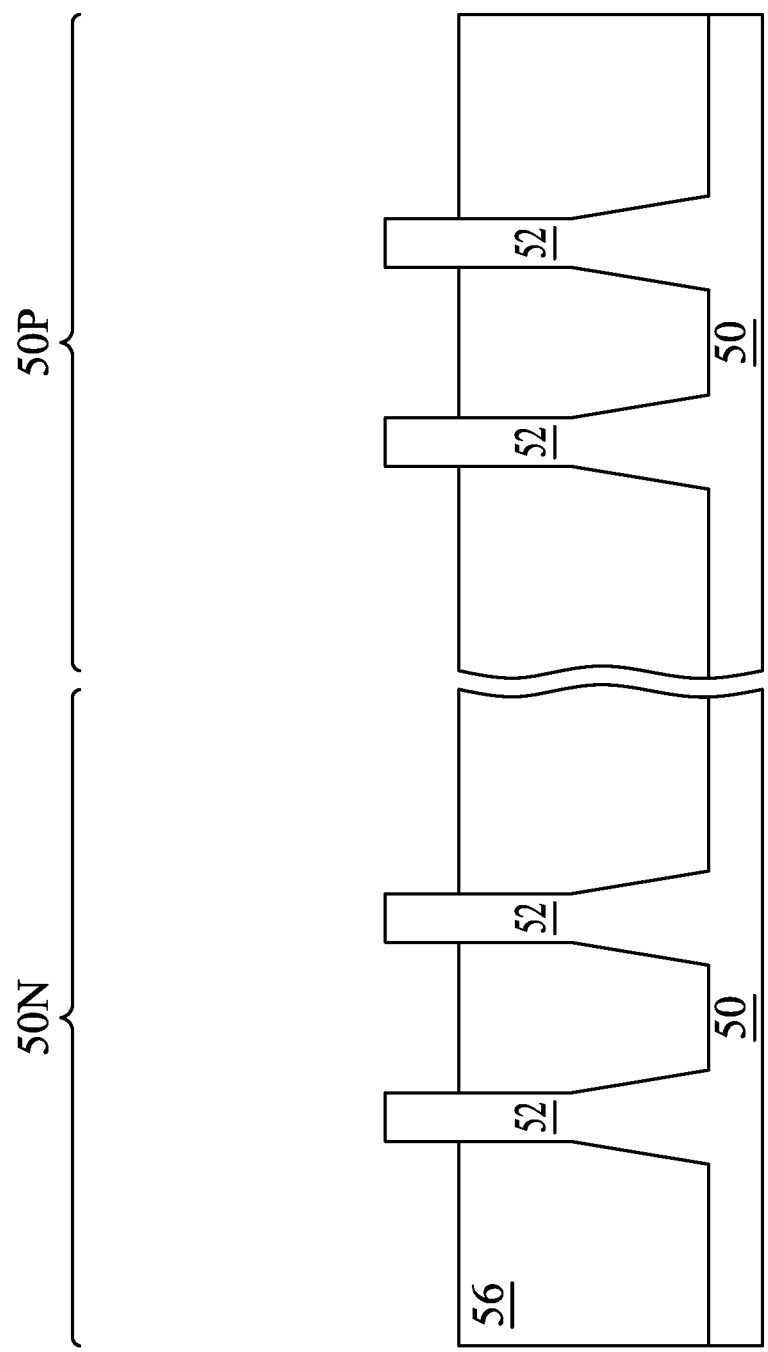

In FIG. 6, the insulation material 54 is recessed to form shallow trench isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface, or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not separately illustrated) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not separately illustrated). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ cm$^3$, such as between about $10^{17}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, BF$_2$, indium, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
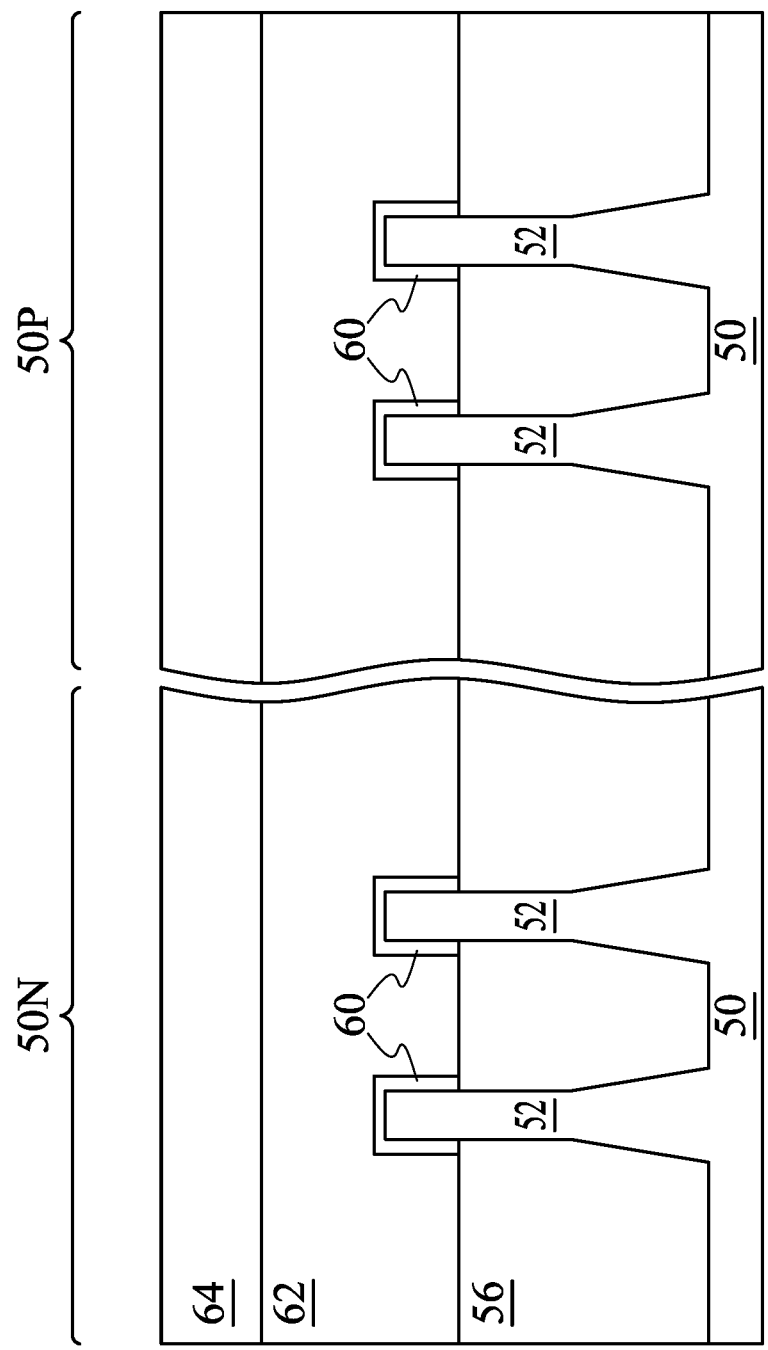

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 17B illustrate various additional steps in the manufacturing of embodiment devices. FIGS. 8A through 17B illustrate features in either of the region 50N and the region 50P. For example, the structures illustrated in FIGS. 8A through 17B may be applicable to both the region 50N and the region 50P. Differences (if any) in the structures of the region 50N and the region 50P are described in the text accompanying each figure.

Figure 8B:
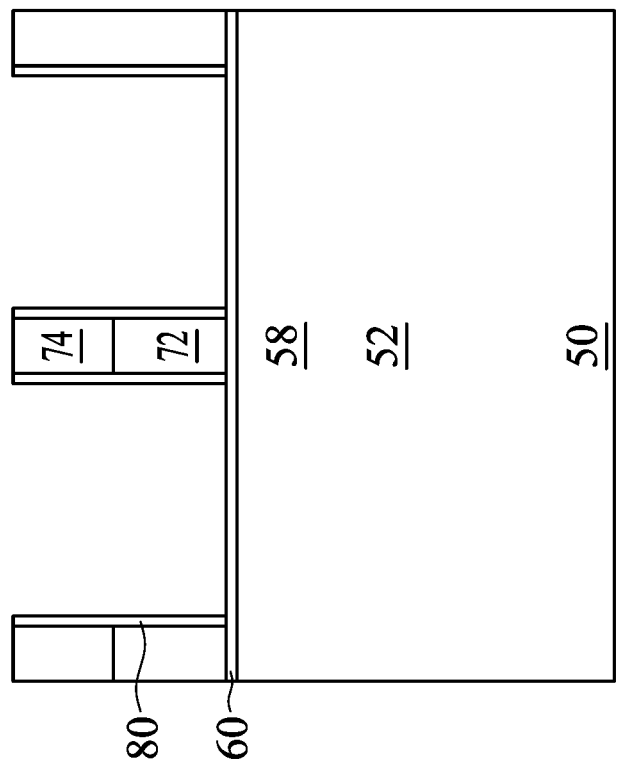
Figure 8A:
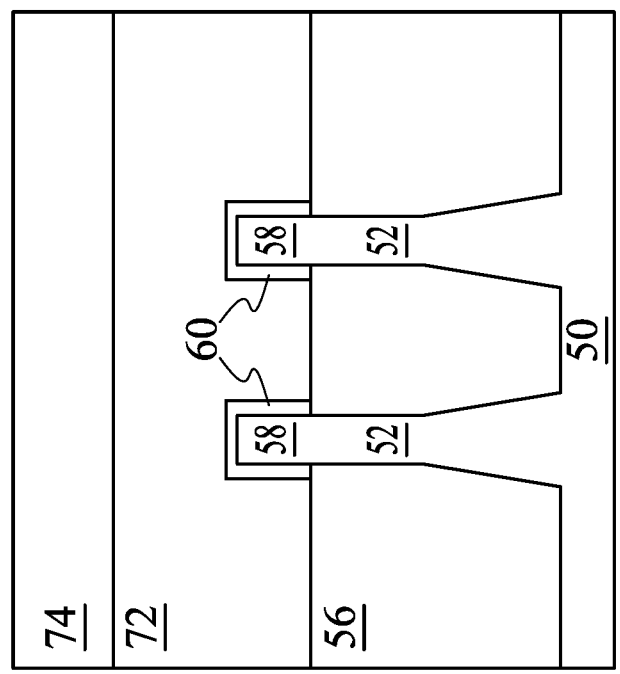

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not separately illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective fins 52.

Further in FIGS. 8A and 8B, gate seal spacers 80 can be formed on exposed surfaces of the dummy gates 72 and/or the masks 74. Although not illustrated in FIGS. 8A and 8B, the gate seal spacers 80 may also be formed on exposed surfaces of the fins 52, such as sidewalls of the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
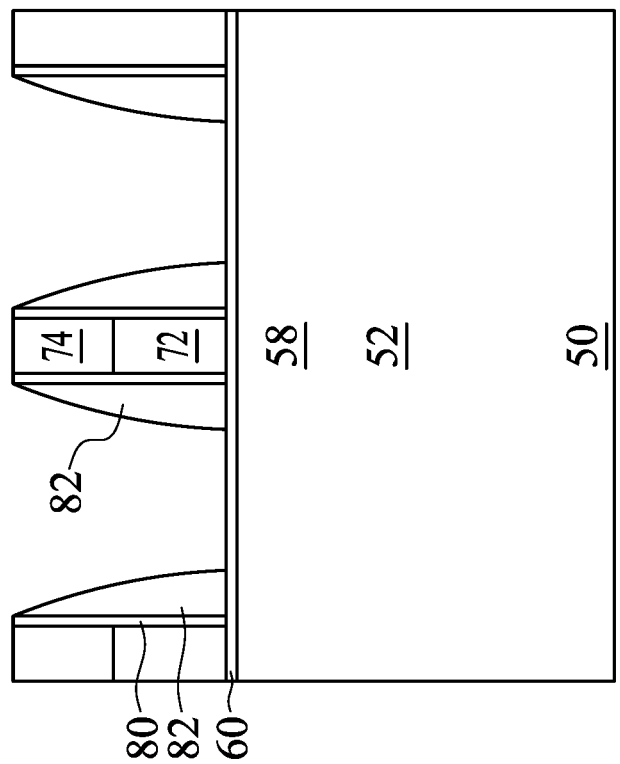
Figure 9A:
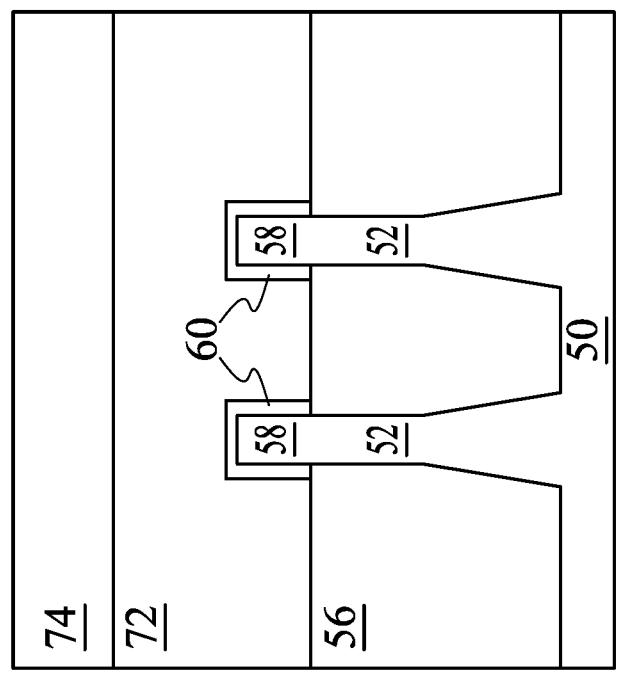

In FIGS. 9A and 9B, gate spacers 82 are formed on the gate seal spacers 80 along sidewalls of the dummy gates 72 and the masks 74. The gate spacers 82 may be formed by conformally depositing an insulating material and subsequently anisotropically etching the insulating material. The insulating material of the gate spacers 82 may be silicon nitride, SiCN, a combination thereof, or the like.

Figure 10B:
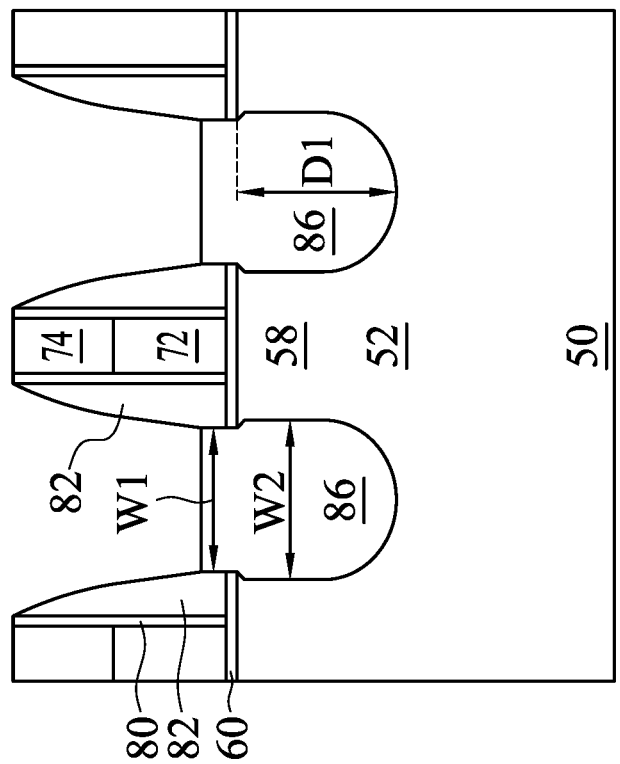
Figure 10A:
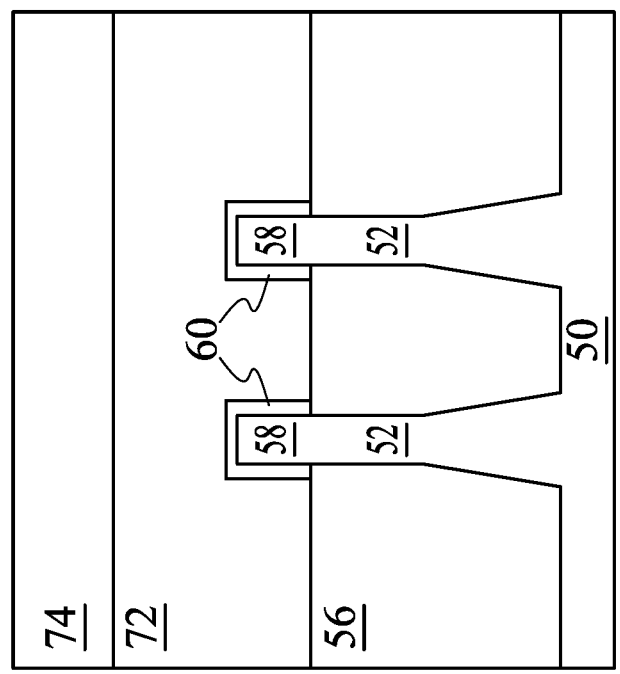
Figure 10C:
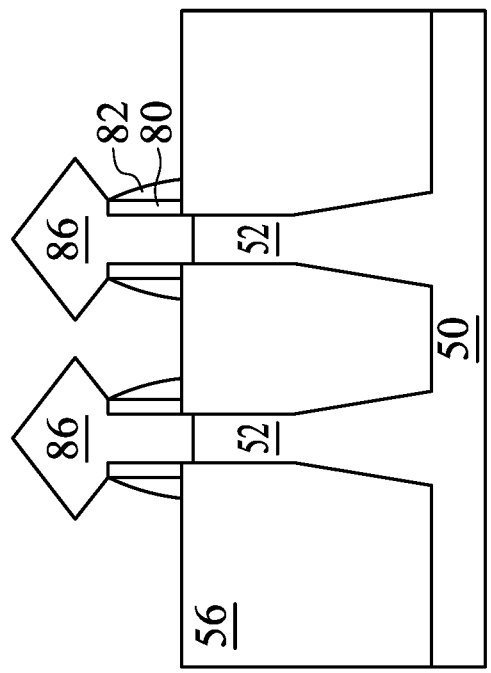
Figure 10D:
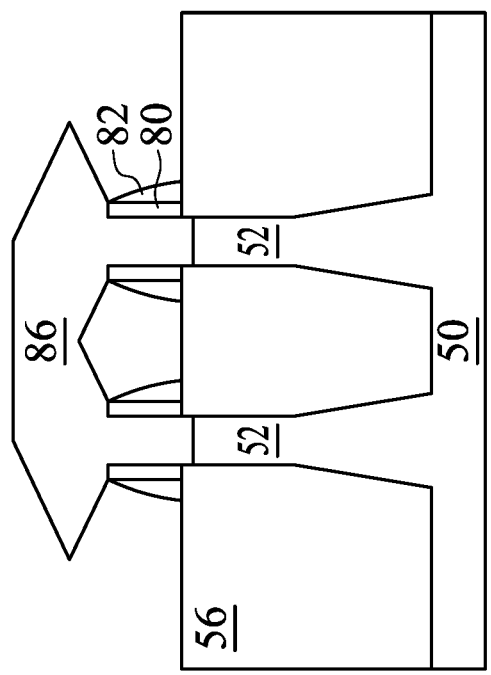

In FIGS. 10A and 10B, source/drain regions 86 are formed in the fins 52 to exert stress in the respective channel regions 58, thereby improving performance. The source/drain regions 86 are formed in the fins 52 such that each dummy gate 72 is disposed between respective neighboring pairs of the source/drain regions 86. In some embodiments the source/drain regions 86 may extend into, and may also penetrate through, the fins 52. In some embodiments, the gate spacers 82 and the gate seal spacers 80 are used to separate the source/drain regions 86 from the dummy gates 72 by an appropriate lateral distance so that the source/drain regions 86 do not short out subsequently formed gates of the resulting FinFETs.

The source/drain regions 86 in the region 50N, e.g., the NMOS region, may be formed by masking the region 50P, e.g., the PMOS region. Recesses are then formed in the fins 52 by etching source/drain regions of the fins 52 in the region 50N. A width W1 of the recesses between the gate spacers 82 of adjacent dummy gates 72 may be from about 20 nm to about 35 nm, such as about 25 nm. As illustrated in FIG. 10B, at least a portion of the recesses may extend below the gate spacers 82 in a direction perpendicular to a major surface of the substrate 50. The recesses may have a width W2 between the channel regions 58 of adjacent dummy gates 72 from about 20 nm to about 40 nm, such as about 30 nm. A depth D1 of the recesses measured from a top surface of the fins 52 may be from about 35 nm to about 60 nm, such as about 40 nm.

The source/drain regions 86 may then be grown in the region 50N using an epitaxial deposition process or the like. The source/drain regions 86 may be formed using epitaxial growth, CVD (e.g., vapor phase epitaxy (VPE)), atomic layer deposition (ALD), plasma-enhanced chemical vapor deposition (PECVD), plasma-enhanced atomic layer deposition (PEALD), molecular beam epitaxy (MBE), metalorganic CVD (MOCVD) or the like. The source/drain regions 86 may include any acceptable material, such as appropriate for n-type FinFETs. For example, if the fins 52 are silicon, the source/drain regions 86 in the region 50N may include materials exerting a tensile strain in the channel region 58, such as silicon, SiC, SiCP, SiP, or the like. In specific embodiments, the source/drain regions 86 may comprise SiP. The source/drain regions 86 may be deposited using silicon precursors including silane ($SiH_4$), dichlorosilane (DCS, $SiH_2Cl_2$), disilane (DS, $Si_2H_6$), trichlorosilane ($SiHCl_3$), tetrachlorosilane ($SiCl_4$), trisilane ($Si_3H_8$), tetrasilane ($Si_4H_{10}$), combinations thereof, or the like and phosphorous precursors including phosphine ($PH_3$), phosphorus trichloride ($PCl_3$), or the like. The source/drain regions 86 may be formed by flowing the silicon precursors at a flowrate from about 50 sccm to about 1,000 sccm, such as about 500 sccm and the phosphorous precursors at a flowrate from about 20 sccm to about 500 sccm, such as about 300 sccm. As such, a ratio of the silicon precursors to the phosphorous precursors is from about 1:1 to about 5:2, such as about 5:3. The source/drain regions 86 may have a phosphorus concentration from about $1\times10^{21}$ to about $5\times10^{21}$ atoms/cm$^3$. The source/drain regions 86 may have a constant composition such that the phosphorus concentration is from about $1\times10^{21}$ to about $5\times10^{21}$ atoms/cm$^3$ adjacent the fins 52.

The source/drain regions 86 may be doped with dopant species in order to further increase the tensile strain in the channel region 58 and to reduce the out-diffusion of dopants form the source/drain regions 86. For example, carbon, having a lattice constant smaller than a lattice of silicon, may be incorporated into the source/drain regions 86 to provide additional tensile strain in the channel region 58. Phosphorous included in the source/drain regions 86 may also increase the tensile strain in the channel region 58. The source/drain regions 86 may be in situ doped with carbon by including carbon precursors, such as monomethylsilane (MMS, $CH_6Si$), ethylene ($C_2H_4$), or the like, in the deposition process used to form the source/drain regions 86. The carbon-containing precursors may be flowed at a flowrate from about 20 sccm to about 300 sccm, such as about 100 sccm whilst forming the source/drain regions 86 such that a ratio of silicon precursors to carbon precursors is from about 1:1 to about 25:1, such as about 5:1. The source/drain regions 86 may have a carbon concentration from about 0.1 atomic percent to about 2 atomic percent.

The source/drain regions 86 may also be doped with dopant species in order to reduce or eliminate the diffusion of dopant species from the source/drain regions 86 to the fins 52. For example, arsenic, having a lower diffusion coefficient than phosphorous, may be incorporated into the source/drain regions 86 to reduce the diffusion of dopants from the source/drain regions 86 to the fins 52. Carbon may also be included in the source/drain regions 86 to reduce the diffusion of dopants from the source/drain regions 86 to the fins 52. Including the low-diffusion coefficient species in the source/drain regions 86 may reduce leakage and drain-induced barrier loading (DIBL) from the source/drain regions 86. The source/drain regions 86 may be in situ doped with arsenic by including arsenic precursors, such as arsine ($AsH_3$), tertiarybutylarsine (TBA, $C_4H_{11}As$), or the like, in the deposition process used to form the source/drain regions 86. The arsenic-containing precursors may be flowed at a flowrate from about 20 sccm to about 500 sccm, such as about 300 sccm whilst forming the source/drain regions 86 such that a ratio of silicon precursors to arsenic precursors is from about 1:1 to about 25:1, such as about 5:3. The source/drain regions 86 may be doped with both carbon and arsenic and a ratio of arsenic precursors to carbon precursors is from about 1:1 to about 5:1, such as about 3:1. The source/drain regions 86 may have an arsenic concentration from about $1\times10^{20}$ to about $3\times10^{21}$ atoms/cm$^3$.

As illustrated in FIGS. 10B-10D, the source/drain regions 86 may comprise a single continuous material, which may comprise SiP:As, SiP:C:As, SiP:C, and which contacts the fins 52 along the entirety of the recesses in which the source/drain regions 86 are formed and extend above top surfaces of the fins 52. The portions of the source/drain regions 86 extending above the fins 52 may have facets. The source/drain regions 86 may be formed by directly exposing surfaces of the fins 52 to the silicon precursors, the phosphorous precursors, the carbon precursors, the arsenic precursors, or a combination thereof.

In embodiments in which the LDD regions are formed in the fins 52, the LDD regions may have a phosphorous concentration from about $1\times10^{19}$ atoms/cm$^3$ to about $1\times10^{20}$ atoms/cm$^3$, such as about $3\times10^{20}$ atoms/cm$^3$ after forming the source/drain regions 86. The remainder of the fins 52 may be undoped after forming the source/drain regions 86. Thus, there may be a step change in the phosphorous concentration at an interface between the source/drain regions 86 and the fins 52 and between the source/drain regions 86 and the LDD regions. A ratio of the phosphorous concentration in the source/drain regions 86 to the phosphorous concentration in the LDD regions may be from about 10:1 to about 500:1, such as about 100:1.

The source/drain regions 86 in the region 50P, e.g., the PMOS region, may be formed by masking the region 50N, e.g., the NMOS region. Recesses are then formed in the fins 52 by etching source/drain regions of the fins 52 in the region 50P. Then, the source/drain regions 86 in the region 50P are epitaxially grown in the recesses. The source/drain regions 86 may include any acceptable material, such as appropriate for p-type FinFETs. For example, if the fin 52 is silicon, the source/drain regions 86 in the region 50P may comprise materials exerting a compressive strain in the channel region 58, such as SiGe, SiGeB, Ge, GeSn, or the like. The source/drain regions 86 in the region 50P may also have surfaces raised from respective surfaces of the fins 52 and may have facets.

The source/drain regions 86 in the region 50P and/or the fins 52 may be implanted with dopants to form source/drain regions, similar to the process previously discussed for forming lightly-doped source/drain regions, followed by an anneal. The source/drain regions may have an impurity concentration from about $10^{19}$ atoms/cm$^3$ and about $10^{21}$ atoms/cm$^3$. The n-type and/or p-type impurities for source/drain regions may be any of the impurities previously discussed. In some embodiments, the source/drain regions 86 may be in situ doped during growth.

As a result of the epitaxy processes used to form the source/drain regions 86 in both the region 50N and the region 50P, upper surfaces of the source/drain regions 86 have facets which expand laterally outward beyond sidewalls of the fins 52. In some embodiments, these facets cause adjacent source/drain regions 86 of a same FinFET to merge, as illustrated by FIG. 10C. In other embodiments, adjacent source/drain regions 86 remain separated after the epitaxy process is completed as illustrated by FIG. 10D.

Co-doping the source/drain regions 86 in the region 50N, e.g., the NMOS region, with low diffusivity dopants allows a material having a greater phosphorus concentration to be used throughout the entire volume of the source/drain regions 86, while reducing leakage and DIBL, which reduces the overall resistance of the source/drain regions 86. This in turn improves DC gain and oscillator speed for transistors including the co-doped source/drain regions 86 and thus device performance is improved.

Figure 11A:
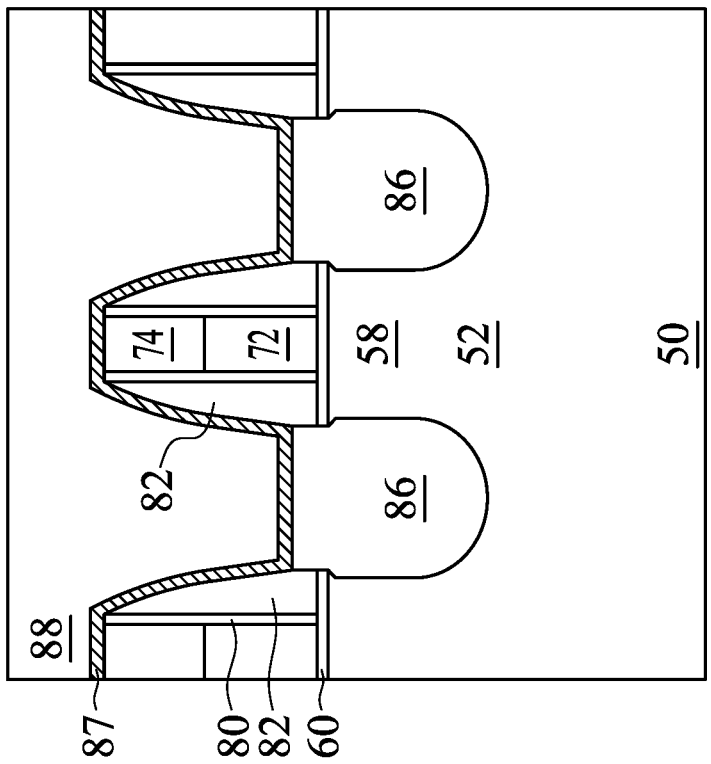
Figure 11B:
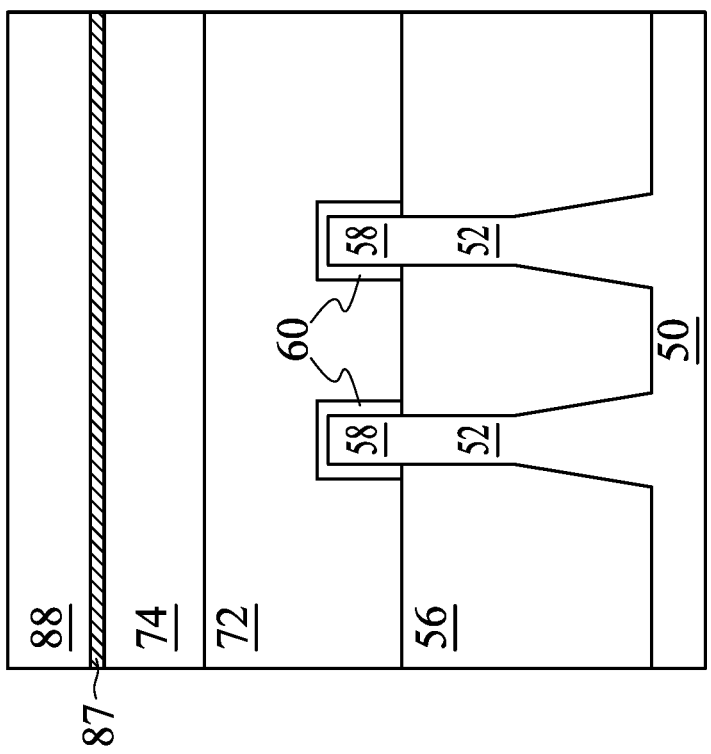

In FIGS. 11A and 11B, a first interlayer dielectric (ILD) 88 is deposited over the structure illustrated in FIGS. 10A-10D. The first ILD 88 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 87 is disposed between the first ILD 88 and the source/drain regions 86, the masks 74, the gate spacers 82, and the gate seal spacers 80. The CESL 87 may comprise a dielectric material, such as, silicon nitride, silicon oxide, silicon oxynitride, or the like, having a different etch rate than the material of the overlying first ILD 88.

Figure 12B:
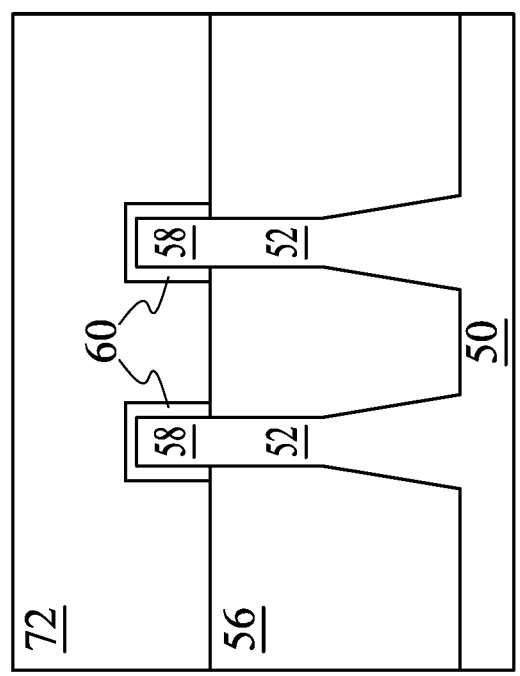
Figure 12A:
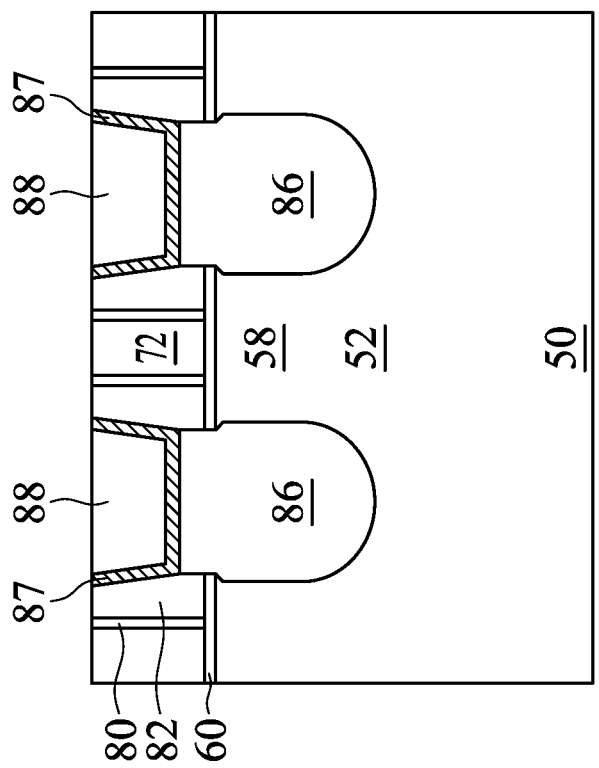

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 82 along sidewalls of the masks 74. After the planarization process, top surfaces of the dummy gates 72, the gate seal spacers 80, the gate spacers 82, the first ILD 88, and the CESL 87 may be level with one another. Accordingly, the top surfaces of the dummy gates 72 may be exposed through the first ILD 88. In some embodiments, the masks 74 may remain, in which case the planarization process levels the top surface of the first ILD 88 with the top surfaces of the masks 74.

Figure 13B:
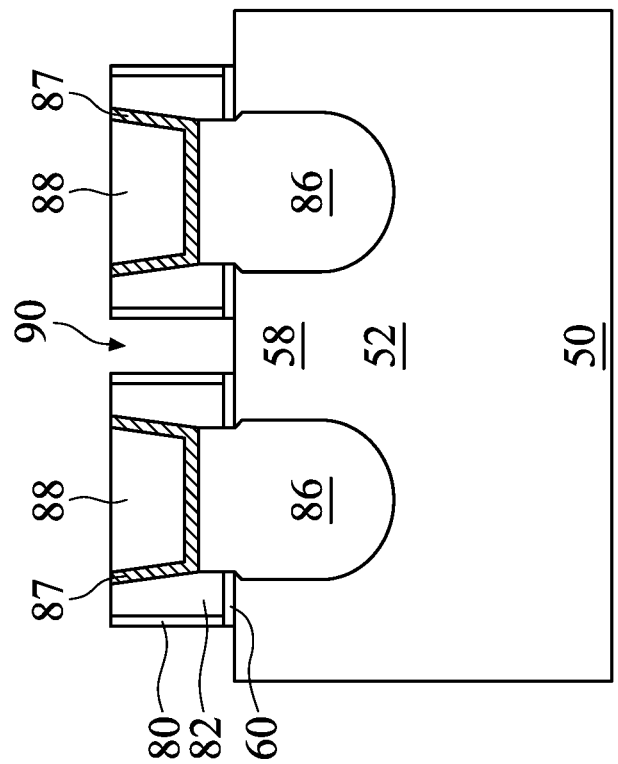
Figure 13A:
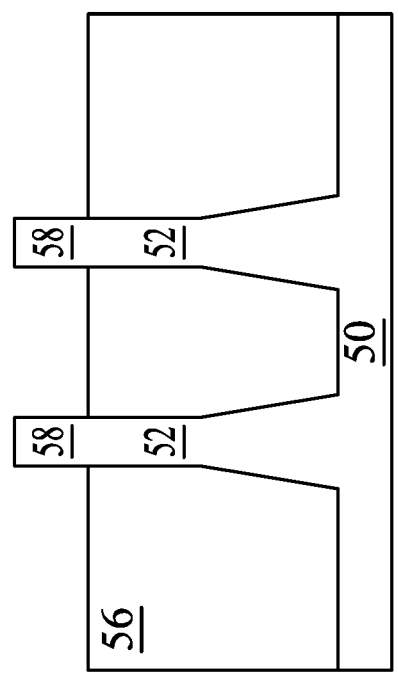

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 82. Each recess 90 exposes a channel region 58 of a respective fin 52. Each channel region 58 is disposed between neighboring pairs of the source/drain regions 86. During the removal, the dummy dielectric layer 60 may be used as an etch stop layer when the dummy gates 72 are etched. The dummy dielectric layer 60 may then be optionally removed after the removal of the dummy gates 72.

Figure 14B:
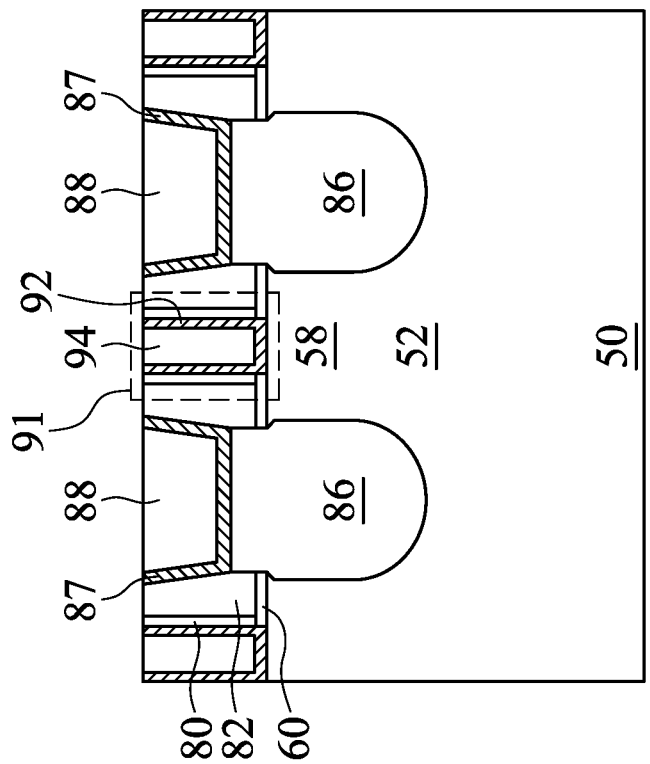
Figure 14A:
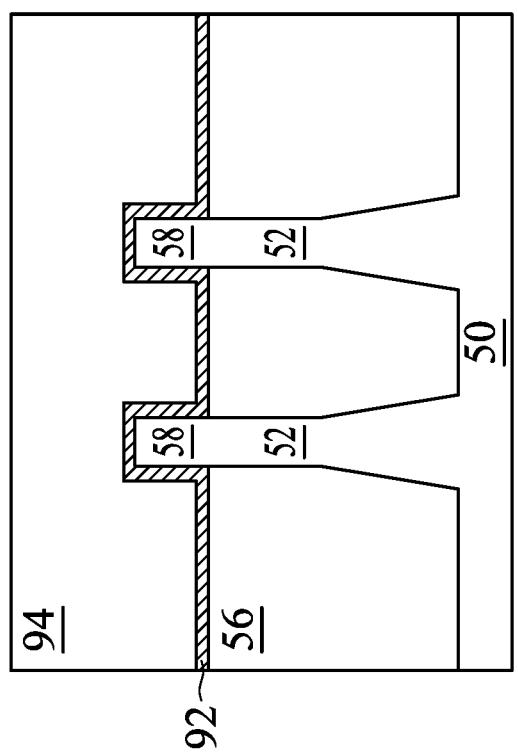
Figure 14C:
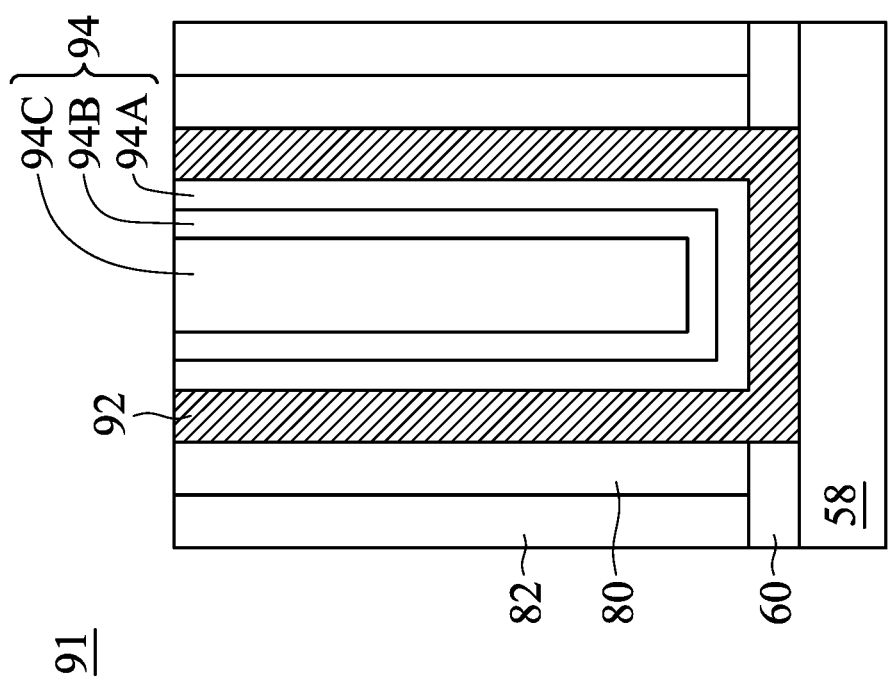

In FIGS. 14A and 14B, gate dielectric layers 92 and gate electrodes 94 are formed for replacement gates. FIG. 14C illustrates a detailed view of region 91 of FIG. 14B. Gate dielectric layers 92 are deposited conformally in the recesses 90, such as on the top surfaces and the sidewalls of the fins 52 and on sidewalls of the gate seal spacers 80/gate spacers 82. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of Hf, Al, Zr, La, Mg, Ba, Ti, Pb, or combinations thereof. The gate dielectric layers 92 may be deposited by molecular-beam deposition (MBD), ALD, PECVD, or the like. In embodiments where portions of the dummy dielectric layer 60 remain in the recesses 90, the gate dielectric layers 92 include a material of the dummy dielectric layer 60 (e.g., $SiO_2$).

The gate electrodes 94 are deposited over the gate dielectric layers 92 and fill the remaining portions of the recesses 90. The gate electrodes 94 may include a metal-containing material such as TiN, TiO, TaN, TaC, Co, Ru, Al, W, combinations thereof, or multi-layers thereof. Although a single-layer gate electrode 94 is illustrated in FIG. 14B, the gate electrode 94 may comprise any number of layers, such as any number of liner layers 94A, any number of work function tuning layers 94B, and a fill material 94C, as illustrated by FIG. 14C. After the filling of the gate electrodes 94, a planarization process, such as a CMP, may be performed to remove the excess portions of the gate dielectric layers 92 and the gate electrodes 94, such as portions of the gate dielectric layers 92 and the gate electrodes disposed above the top surface of the first ILD 88. The remaining portions the gate dielectric layers 92 and the gate electrodes 94 form replacement gates of the resulting FinFETs. The gate electrodes 94 and the gate dielectric layers 92 may collectively be referred to as a "gate," a "replacement gate,"

or a "gate stack." The gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 in the region 50N and the region 50P may be different materials, and/or the gate electrodes 94 in each region may be formed by distinct processes, such that the gate electrodes 94 in the region 50N and the region 50P may be different materials. Various masking steps may be used to mask and expose appropriate regions when using distinct processes.

In FIGS. 15A and 15B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including the gate dielectric layers 92 and the gate electrode 94) may be recessed, so that a recess is formed directly over the gate stack and between opposing portions of the gate seal spacers 80, as illustrated in FIGS. 15A and 15B. A gate mask 96 comprising one or more layers of dielectric material, such as silicon nitride, silicon oxynitride, or the like, is filled in the recess, followed by a planarization process to remove excess portions of the dielectric material extending above the top surface of the first ILD 88. The subsequently formed gate contacts no (illustrated in FIGS. 17A and 17B) penetrate through the gate mask 96 to contact the top surface of the recessed gate electrode 94.

In FIGS. 16A and 16B, openings 111 are formed extending through the second ILD 108, the first ILD 88, the CESL 87, and into the source/drain regions 86 and silicide regions 98 are formed in the source/drain regions 86. The openings 111 may be formed by an acceptable etch process, such as an anisotropic etch process including RIE, NBE, or the like. The openings 111 may extend a depth D2 into the source/drain regions 86, measured from the top surfaces of the source/drain regions 86 to a bottom surface of the openings 111, from about 5 nm to about 15 nm, such as about 10 nm. The silicide regions 98 may be formed by first depositing a metal capable of reacting with semiconductor materials (e.g., silicon or germanium) to form silicide or germanide regions, such as nickel, cobalt, titanium, tantalum, platinum, tungsten, other noble metals, other refractory metals, rare earth metals or their alloys, over the source/drain regions 86. A thermal anneal process is then used to form the silicide regions 98. Any un-reacted portions of the deposited metal are removed, e.g., by an etching process. In a specific embodiment, the silicide regions 98 comprise TiSi. Although the regions 98 are referred to as silicide regions, the regions 98 may also be germanide regions or silicon germanide regions (e.g., regions comprising silicide and germanide). A thickness T1 of the silicide regions 98 may be from about 2 nm to about 10 nm, such as about 6 nm.

Figure 17B:
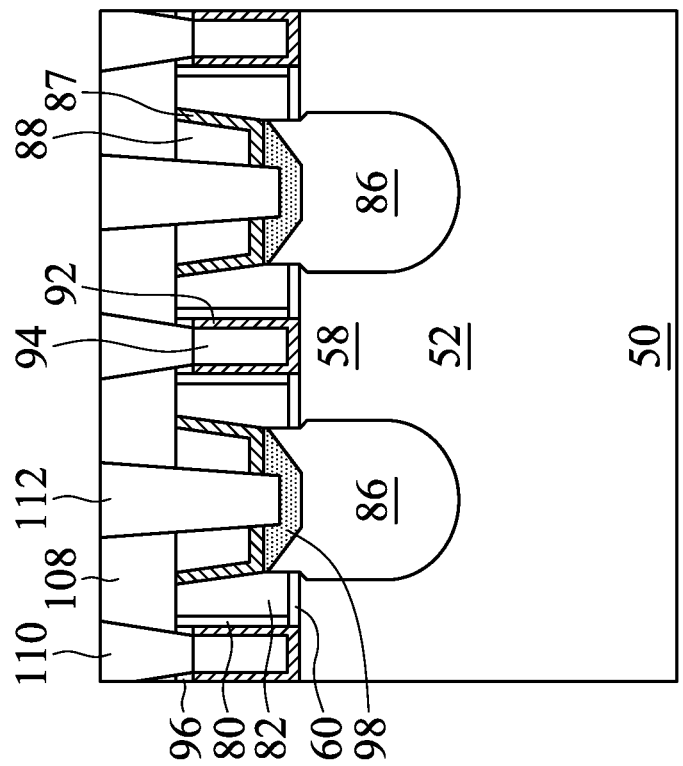
Figure 17A:
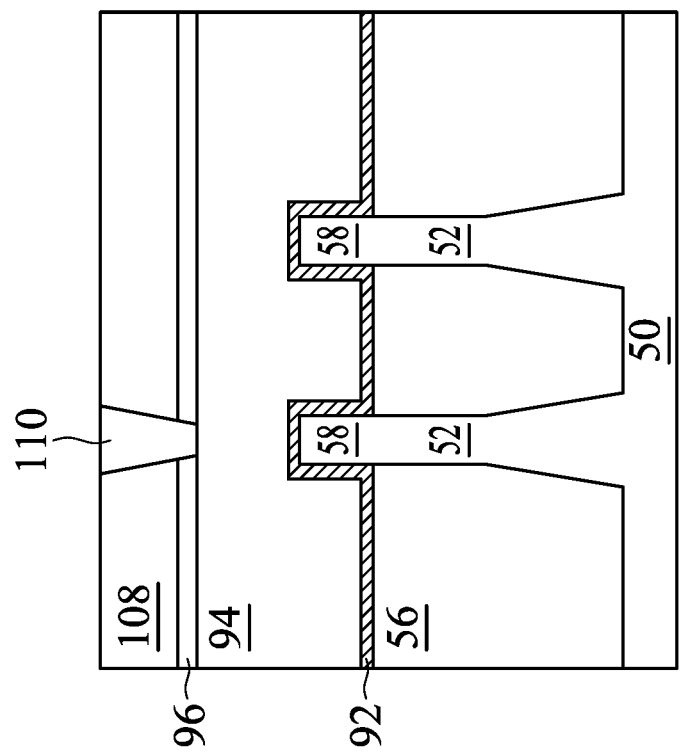

In FIGS. 17A and 17B, gate contacts 110 and source/drain contacts 112 are formed through the second ILD 108 and the first ILD 88 in accordance with some embodiments. The source/drain contacts 112 are formed in the openings 111. Openings for the gate contacts 110 are formed through the second ILD 108 and the gate mask 96. The openings for the gate contacts 110 may be formed using acceptable photolithography and etching techniques. A liner, such as a diffusion barrier layer, an adhesion layer, or the like, and a conductive material are formed in the openings 111 and the openings for the gate contacts 110. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings 111 and the openings for the gate contacts 110. In some embodiments, a silicide, such as the silicide region 98, may be formed at the interface between the source/drain regions 86 and the source/drain contacts 112 by performing an anneal process after depositing the source/drain contacts 112. The source/drain contacts 112 are physically and electrically coupled to the source/drain regions 86, and the gate contacts 110 are physically and electrically coupled to the gate electrodes 94. The source/drain contacts 112 and the gate contacts 110 may be formed in different processes, or may be formed in the same process. Although shown as being formed in the same cross-sections, it should be appreciated that each of the source/drain contacts 112 and the gate contacts 110 may be formed in different cross-sections, which may avoid shorting of the contacts.

As described above, forming the source/drain regions 86 of a semiconductor material doped with low-diffusivity dopants reduces the leakage and DIBL of the source/drain regions 86, while allowing the source/drain regions 86 to have a greater concentration of dopants, which reduces the overall resistance of the source/drain regions 86. This improves device DC gain and oscillator speed for devices including the source/drain regions 86 and results in improved device performance.

In accordance with an embodiment, a method includes etching a semiconductor fin to form a first recess, the semiconductor fin defining sidewalls and a bottom surface of the first recess, the semiconductor fin extending in a first direction; forming a source/drain region in the first recess, the source/drain region including a single continuous material extending from a bottom surface of the first recess to above a top surface of the semiconductor fin, a precursor gas for forming the source/drain region including phosphine ($PH_3$) and at least one of arsine ($AsH_3$) or monomethylsilane ($CH_6Si$); and forming a gate over the semiconductor fin adjacent the source/drain region, the gate extending in a second direction perpendicular the first direction. In an embodiment, the source/drain region is formed in an NMOS region of a semiconductor device. In an embodiment, the source/drain region is formed at a temperature from 400° C. to 800° C. In an embodiment, the source/drain region is formed at a pressure from 5 torr to 600 torr. In an embodiment, the first recess has a depth from 35 to 60 nm below the top surface of the semiconductor fin and a width from 20 to 35 nm. In an embodiment, the source/drain region has a phosphorus concentration from $1\times10^{21}$ to $5\times10^{21}$ atoms/cm$^3$ and a carbon concentration from 0.1 to 2 atomic percent. In an embodiment, the source/drain region has a phosphorus concentration from $1\times10^{21}$ to $5\times10^{21}$ atoms/cm$^3$ and an arsenic concentration from $1\times10^{20}$ to $3\times10^{21}$ atoms/cm$^3$.

In accordance with another embodiment, a method includes forming a fin extending from a substrate; forming a gate stack over the fin; forming a gate spacer along a sidewall of the gate stack; etching the fin to form a first recess, the first recess extending under the gate spacer in a direction perpendicular to a major surface of the substrate; and epitaxially depositing a source/drain material in the first recess, the source/drain material comprising SiP doped with arsenic, the source/drain material extending under the gate spacer in the direction perpendicular to the major surface of the substrate, the source/drain material contacting a horizontal surface and a vertical surface of the fin. In an embodiment, the source/drain material has a phosphorus concentration from $1\times10^{21}$ to $5\times10^{21}$ atoms/cm$^3$ and an arsenic concentration from $1\times10^{20}$ to $3\times10^{21}$ atoms/cm$^3$. In an embodiment, the source/drain material further includes carbon, and the source/drain material has a phosphorus concentration from $1\times10^{21}$ to $5\times10^{21}$ atoms/cm$^3$ and a carbon concentration from 0.1 to 2 atomic percent. In an embodiment, the source/drain material has an arsenic concentration from $1\times10^{20}$ to $3\times10^{21}$ atoms/cm$^3$. In an embodiment, the method further includes forming a silicide region at a top surface of the source/drain material, the silicide region having a thickness from 2 nm to 10 nm. In an embodiment, the silicide region includes TiSi. In an embodiment, the method further includes forming a source/drain contact in contact with the silicide region, the source/drain contact extending into the source/drain material from 5 nm to 15 nm below a top surface of the source/drain material. In an embodiment, the source/drain contact includes tungsten.

In accordance with yet another embodiment, a method includes etching a semiconductor fin to form a recess; forming a source/drain region in the recess, the source/drain region including a semiconductor material, the semiconductor material including SiP doped with arsenic and carbon, the SiP doped with arsenic and carbon contacting the semiconductor fin along sidewalls and a bottom surface of the recess; forming a gate over the semiconductor fin adjacent the source/drain region; forming a silicide region in the source/drain region; and forming a source/drain contact extending into the silicide region. In an embodiment, the silicide region includes TiSi and the source/drain contact includes tungsten. In an embodiment, the source/drain region has a phosphorus concentration from $1\times10^{21}$ to $5\times10^{21}$ atoms/cm$^3$, an arsenic concentration from $1\times10^{20}$ to $3\times10^{21}$ atoms/cm$^3$, and a carbon concentration from 0.1 to 2 atomic percent. In an embodiment, the source/drain region is formed using a first precursor comprising at least one of silane (SiH$_4$), dichlorosilane (SiH$_2$Cl$_2$), or disilane (Si$_2$H$_6$) and a second precursor comprising phosphine (PH$_3$), arsine (AsH$_3$), and monomethylsilane (CH$_6$Si). In an embodiment, the source/drain region is formed at a temperature from 400° C. to 800° C. and a pressure of 5 torr to 600 torr.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a semiconductor fin to form a first recess and a second semiconductor fin to form a second recess, the semiconductor fin defining sidewalls and a bottom surface of the first recess, the semiconductor fin extending in a first direction;
   forming a source/drain region in the first recess, the source/drain region comprising a single continuous material extending from a bottom surface of the first recess to above a top surface of the semiconductor fin, a precursor gas for forming the source/drain region comprising phosphine (PH$_3$) and at least one of arsine (AsH$_3$) or monomethylsilane (CH$_6$Si), a local maximum width of the source/drain region above a top surface of the semiconductor fin being less than a local maximum width of the source/drain region below the top surface of the semiconductor fin, the single continuous material comprising SiP:C:As;
   forming a second source/drain region in the second recess, the second source/drain region comprising the single continuous material, wherein the single continuous material of the second source/drain region merges with the single continuous material of the source/drain region; and
   forming a gate over the semiconductor fin adjacent the source/drain region, the gate extending in a second direction perpendicular the first direction.

2. The method of claim 1, wherein the source/drain region is formed in an NMOS region of a semiconductor device.

3. The method of claim 1, wherein the source/drain region is formed at a temperature from 400° C. to 800° C.

4. The method of claim 1, wherein the source/drain region is formed at a pressure from 5 torr to 600 torr.

5. The method of claim 1, wherein the first recess has a depth from 35 to 60 nm below the top surface of the semiconductor fin and a width from 20 to 35 nm.

6. The method of claim 1, wherein the source/drain region has a phosphorus concentration from $1\times10^{21}$ to $5\times10^{21}$ atoms/cm$^3$ and a carbon concentration from 0.1 to 2 atomic percent.

7. The method of claim 1, wherein the source/drain region has a phosphorus concentration from $1\times10^{21}$ to $5\times10^{21}$ atoms/cm$^3$ and an arsenic concentration from $1\times10^{20}$ to $3\times10^{21}$ atoms/cm$^3$.

8. A method comprising:
   forming a fin extending from a substrate;
   forming a gate stack over the fin;
   forming a gate seal spacer along a sidewall of the gate stack;
   forming a lightly doped source/drain (LDD) region in the fin using the gate stack and the gate seal spacer as a mask, the LDD region comprising silicon doped with phosphorous;
   forming a gate spacer over the LDD region along a sidewall of the gate seal spacer;
   etching the fin to form a first recess, the first recess extending under the gate spacer in a direction perpendicular to a major surface of the substrate; and
   epitaxially depositing a source/drain material in the first recess, the source/drain material comprising SiP doped with arsenic, the source/drain material extending under the gate spacer in the direction perpendicular to the major surface of the substrate, the source/drain material contacting a vertical surface of the fin, wherein a first width of the source/drain material in a direction parallel to the major surface of the substrate at a point level with a top surface of the fin is less than a second width of the source/drain material in the direction parallel to the major surface of the substrate at a point below the top surface of the fin, wherein the source/drain material is in contact with a horizontal surface of the fin, a vertical surface of the gate seal spacer, the gate spacer, and the LDD region.

9. The method of claim 8, wherein the source/drain material has a phosphorus concentration from $1\times10^{21}$ to $5\times10^{21}$ atoms/cm$^3$ and an arsenic concentration from $1\times10^{20}$ to $3\times10^{21}$ atoms/cm$^3$.

10. The method of claim 8, wherein the source/drain material further comprises carbon, and wherein the source/drain material has a phosphorus concentration from $1\times10^{21}$ to $5\times10^{21}$ atoms/cm$^3$ and a carbon concentration from 0.1 to 2 atomic percent.

11. The method of claim 10, wherein the source/drain material has an arsenic concentration from $1\times10^{20}$ to $3\times10^{21}$ atoms/cm$_3$.

12. The method of claim 8, further comprising forming a silicide region at a top surface of the source/drain material, the silicide region having a thickness from 2 nm to 10 nm.

13. The method of claim 12, wherein the silicide region comprises TiSi.

14. The method of claim 13, further comprising forming a source/drain contact in contact with the silicide region, the source/drain contact extending into the source/drain material from 5 nm to 15 nm below a top surface of the source/drain material.

15. The method of claim 14, wherein the source/drain contact comprises tungsten.

16. A method comprising:
    forming a dummy gate structure over a semiconductor fin, the dummy gate structure comprising a dummy dielectric layer on the semiconductor fin;
    forming a gate seal spacer on a sidewall of the dummy gate structure;
    forming a gate spacer on a sidewall of the gate seal spacer;
    etching the semiconductor fin to form a recess using the gate spacer as a mask;
    forming a source/drain region in the recess, the source/drain region comprising a semiconductor material, the semiconductor material comprising SiP doped with arsenic and carbon, the SiP doped with arsenic and carbon contacting the semiconductor fin along sidewalls and a bottom surface of the recess, a first width of the source/drain region below a top surface of the semiconductor fin being greater than a second width of the source/drain region level with the top surface of the semiconductor fin, the first width and the second width being measured between vertical sidewalls of the source/drain region, wherein the SiP doped with arsenic and carbon further contacts a vertical sidewall of the dummy dielectric layer, a vertical sidewall and a horizontal surface of the gate seal spacer, and a sidewall of the gate spacer;
    replacing at least a portion of the dummy gate structure with a gate over the semiconductor fin adjacent the source/drain region;
    forming a silicide region in the source/drain region; and
    forming a source/drain contact extending into the silicide region.

17. The method of claim 16, wherein the silicide region comprises TiSi and the source/drain contact comprises tungsten.

18. The method of claim 16, wherein the source/drain region has a phosphorus concentration from $1\times10^{21}$ to $5\times10^{21}$ atoms/cm$^3$, an arsenic concentration from $1\times10^{20}$ to $3\times10^{21}$ atoms/cm$^3$, and a carbon concentration from 0.1 to 2 atomic percent.

19. The method of claim 16, wherein the source/drain region is formed using a first precursor comprising at least one of silane (SiH$_4$), dichlorosilane (SiH$_2$Cl$_2$), or disilane (Si$_2$H$_6$) and a second precursor comprising phosphine (PH$_3$), arsine (AsH$_3$), and monomethylsilane (CH$_6$Si).

20. The method of claim 16, wherein the source/drain region is formed at a temperature from 400° C. to 800° C. and a pressure of 5 torr to 600 torr.

* * * * *

UNITED STATES PATENT AND TRADEMARK OFFICE
CERTIFICATE OF CORRECTION

PATENT NO.         : 11,069,578 B2                                      Page 1 of 1
APPLICATION NO.    : 16/427981
DATED              : July 20, 2021
INVENTOR(S)        : Tzu-Ching Lin It is certified that error appears in the above-identified patent and that said Letters Patent is hereby corrected as shown below:

In the Claims

In Claim 11, Column 15; Line 15 delete "$cm_3$" insert --$cm^3$--

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*